US008368093B2

(12) United States Patent
Chen et al.

(10) Patent No.: US 8,368,093 B2

(45) Date of Patent: Feb. 5, 2013

(54) LED UNIT

(75) Inventors: Chin-Chung Chen, Taipei Hsien (TW); Shi-Yu Song, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 235 days.

(21) Appl. No.: 12/772,997

(22) Filed: May 3, 2010

(65) Prior Publication Data

US 2011/0140145 A1 Jun. 16, 2011

(30) Foreign Application Priority Data

Dec. 16, 2009 (CN) .......................... 2009 1 0311624

(51) Int. Cl.
*H01L 33/00* (2010.01)

(52) U.S. Cl. ...................... 257/95; 362/311.02; 362/335

(58) Field of Classification Search .................... 257/95, 257/E33.073; 362/311.02, 327, 335
See application file for complete search history.

(56) References Cited

U.S. PATENT DOCUMENTS

| | | | | |
|---|---|---|---|---|
| 7,473,013 | B2 * | 1/2009 | Shimada | 362/327 |
| 2009/0052190 | A1 | 2/2009 | Shimada | |
| 2009/0154185 | A1 * | 6/2009 | Yagi | 362/516 |
| 2011/0080725 | A1 * | 4/2011 | Brands et al. | 362/187 |

FOREIGN PATENT DOCUMENTS

CN 1864026 A 11/2006

* cited by examiner

*Primary Examiner* — Caridad Everhart

(74) *Attorney, Agent, or Firm* — Altis Law Group, Inc.

(57) ABSTRACT

An LED unit includes an LED and a lens mounted on the LED. The lens includes a light-incident face adjacent to the LED, a light-emergent face remote from the LED, and a light-reflecting face between the light-incident face and the light-emergent face. The light-incident face includes a first light-incident face which faces the LED, and the light-emergent face includes a first light-emergent face located opposite to the first light-incident face. The first light-emergent face is a continuously curved face which has a curvature firstly increasing gradually and then decreasing gradually along a bottom-to-top direction of the lens.

18 Claims, 3 Drawing Sheets

LED UNIT

BACKGROUND

1. Technical Field

The present disclosure relates to a light emitting diode (LED) unit and, more particularly, to an LED unit having a lens which can produce an effectively converged light beam.

2. Description of Related Art

LEDs, available since the early 1960's and because of their high light-emitting efficiency, have been increasingly used in a variety of occasions, such as residential, traffic, commercial, and industrial occasions. Conventionally, light directly output from the LED does not have a desirable pattern; therefore, a light-adjusting element, such as a lens, is used with the LED to modulate the light pattern thereof.

However, a typical lens generally has a limited light-converging capability; that is, the light passing through the lens cannot be effectively converged to have a small light-emergent angle. Thus, the light pattern output from the lens may have a yellow annulus or shining annulus appearing at a periphery thereof, adversely affecting illumination effect of the LED.

What is needed, therefore, is an LED unit which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
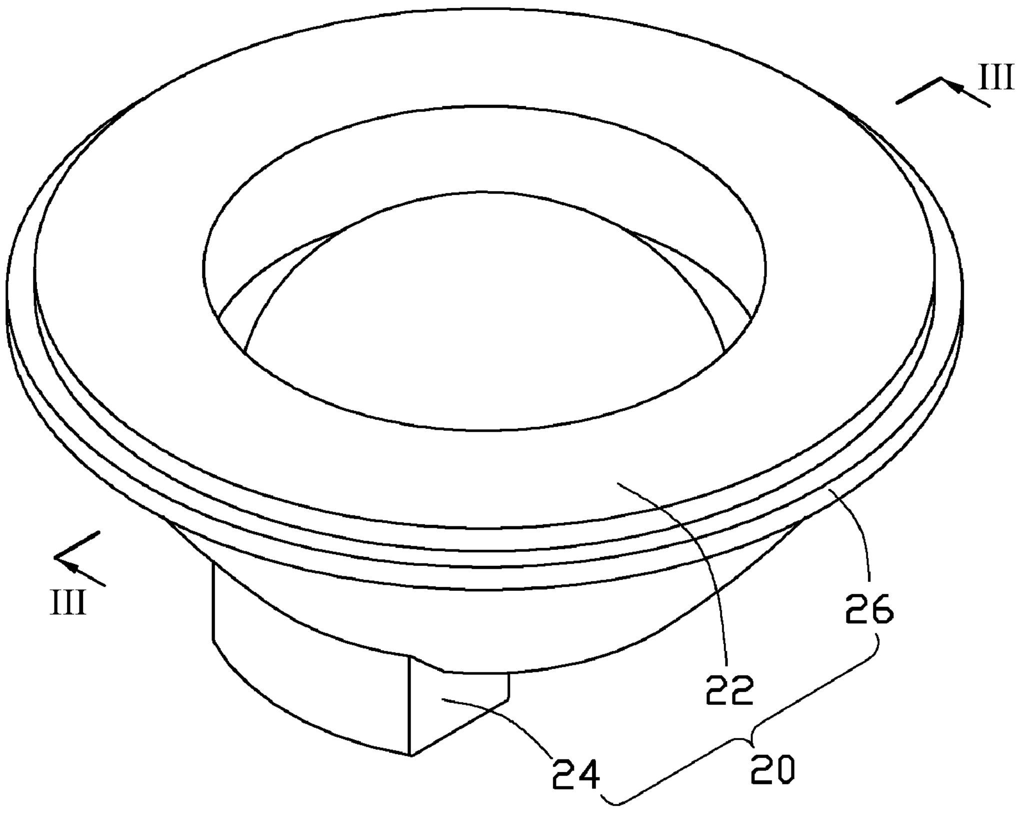
FIG. 1 is an isometric view of an LED unit of the disclosure.
Figure 2:
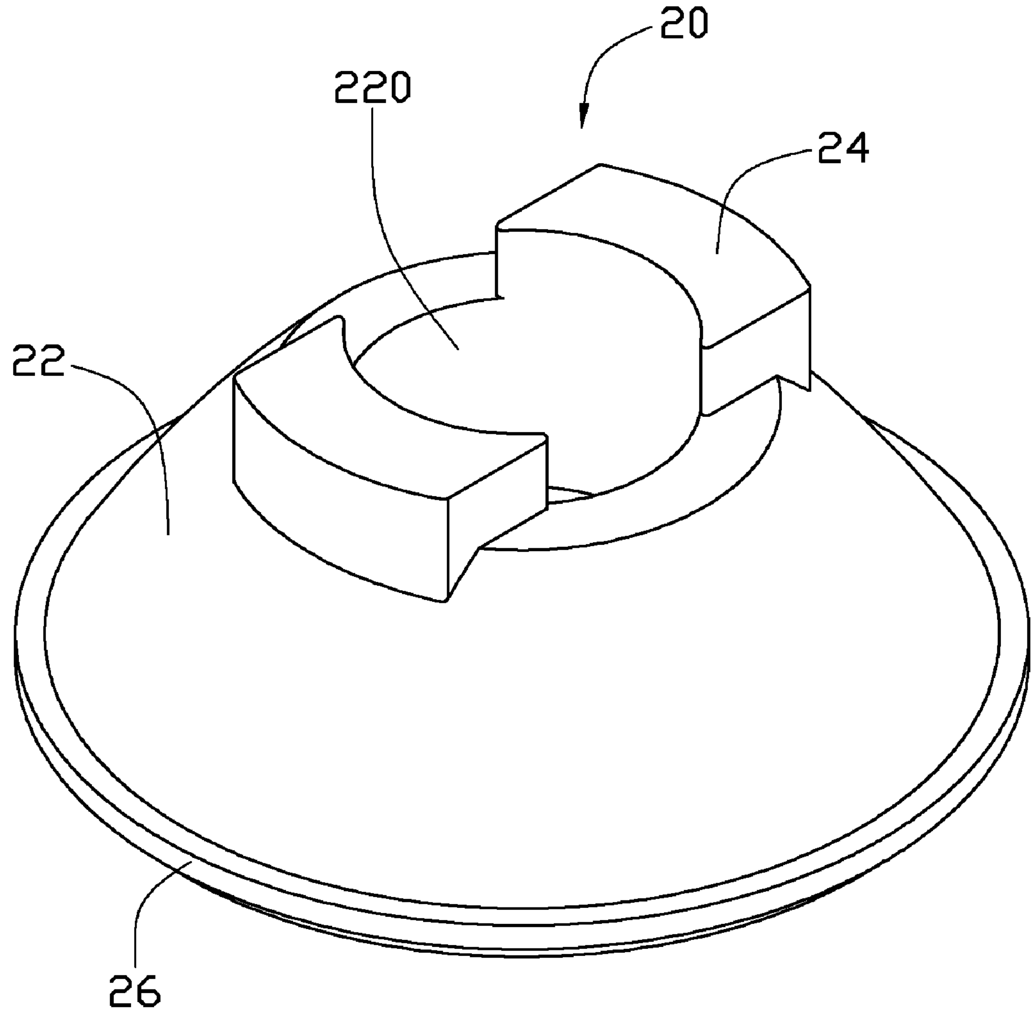
FIG. 2 is an inverted view of a lens of the LED unit of FIG. 1.
Figure 3:
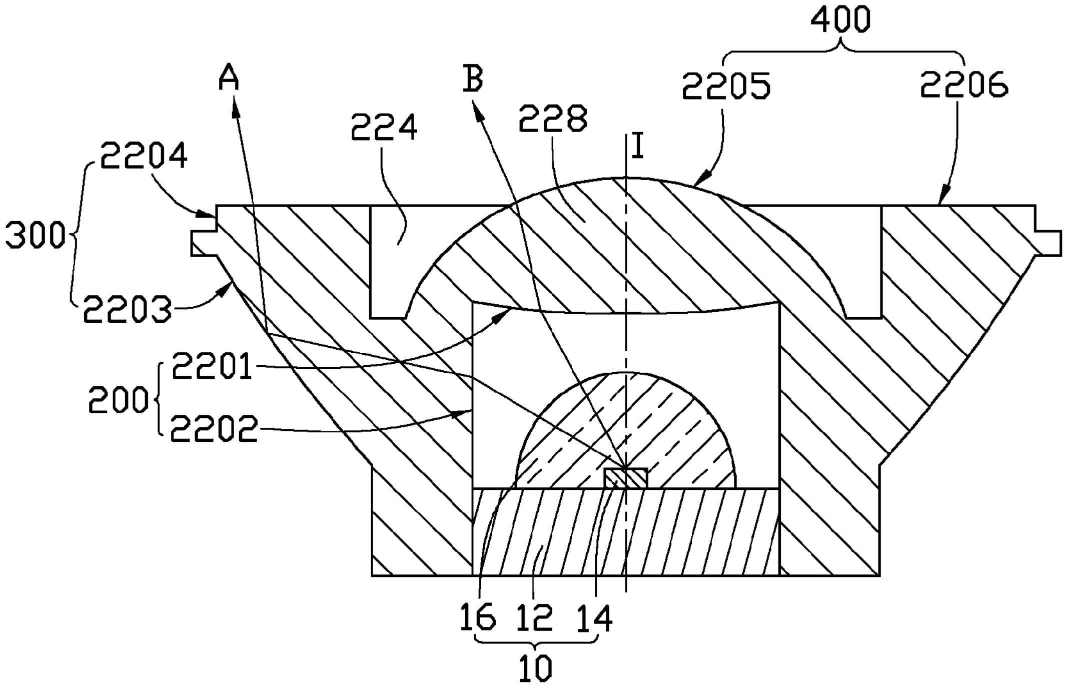
FIG. 3 is a cross-section view of the LED unit of FIG. 1, taken along line III-III thereof.

Referring to FIGS. 1-3, an LED unit of the present disclosure is illustrated. The LED unit comprises an LED 10 and a lens 20 mounted on the LED 10. The LED 10 comprises a heat-conducting base 12, an LED die 14 mounted on a top of the base 12, and an encapsulant 16 covering the LED die 14 and fixed on the top of the base 12. The base 12 of the LED 10 is soldered on a printed circuit board (not shown) to conduct heat generated by the LED die 14 to the printed circuit board. In addition, the LED die 14 is electrically connected with the printed circuit board via the base 12. The LED die 14 may be an InGaN chip, an InGaAs chip, a GaP chip or other suitable chips which could generate visible light with a desirable color. The encapsulant 16 is made by epoxy, silicon, glass or other transparent materials which have good light-permeable and water-proof capabilities. Phosphor may be doped within the encapsulant 16 to adjust the color of the light emitted from the LED die 14. The encapsulant 16 is shaped like a dome so as to collimate the light from the LED die 14 into a converged beam. The LED 10 has an optical axis I, around which the light emitted from the encapsulant 16 is symmetrical in a surrounding space. The optical axis I extends through a center of the LED 10.

The lens 20 is made of transparent materials such as PC (polycarbonate) or PMMA (polymethyl methacrylate). The lens 20 comprises an optical member 22, two opposite substrates 24 extending downwardly from a bottom face of the optical member 22 for supporting the optical member 22, and a flange 26 extending outwardly from a circumference of a top of the optical member 22, for being pressed by a clip (not shown) against the printed circuit board to thereby secure the lens 20 on the printed circuit board. A cavity 220 is defined in an interior of the lens 20. The cavity 220 defines an opening (not labeled) at the bottom face of the optical member 22. When the lens 20 is assembled to the LED 10, the LED die 14 and the encapsulant 16 are received in the cavity 220, and the base 12 is sandwiched between the two substrates 24. The cavity 220 has a shape like a column. An inner face of the lens 20 which faces downwardly toward the encapsulant 16 of the LED 10 functions as a first light-incident face 2201 of the lens 20 to receive the light emitted from the LED 10 with a small light-emergent angle (such as a light B shown in FIG. 3). Another inner surface of the lens 20 surrounding the encapsulant 16 of the LED 10 functions as a second light-incident face 2202 of the lens 20 to receive the light emitted from the LED 10 with a large light-emergent angle (such as a light A shown in FIG. 3). The first light-incident face 2201 is curved and slightly protrudes inwardly towards the LED 10, and the second light-incident face 2202 is a circumferential face of a column. In the embodiment of this disclosure, the first light-incident face 2201 is a spherical surface and has a curvature of 0.04 $mm^{-1}$. The first light-incident face 2201 and the second light-incident face 2202 cooperatively form a light-incident face 200 to refract all of the light of the LED 10 into the lens 20.

The optical member 22 has an upwardly-expanding bowl shape. An outer circumference of the optical member 22 functions as a light-reflecting face 300 of the lens 20 to totally reflect the light transferred from the second light-incident face 2202 towards the top of the lens 20. Alternatively, the light-reflecting face 300 can be further coated with a reflective layer (such as aluminum layer or silver layer) for promoting light reflection. The flange 26 is extended along the light-reflecting face 300. The light-reflecting face 300 is divided by the flange 26 into a first light-reflecting face 2203 and a second light-reflecting face 2204. The first light-reflecting face 2203 is conical and expands from the bottom towards the top of the lens 20. In the embodiment of this disclosure, the first light-reflecting face 2203 is a spherical surface and has a curvature of 0.0187 $mm^{-1}$. The second light-reflecting face 2204 is vertical.

The optical member 22 has a top face which is planar and circular. A center of the top face of the optical member 22 is concaved downwardly to form a columnar recessed portion 224. The recessed portion 224 is centrosymmetric relative to the optical axis I of the LED 10. The top face of the optical member 22 directly connects with the second light-reflecting face 2204. A protrusion 228 is protruded upwardly from a central area of a bottom face of the recessed portion 224. The protrusion 228 is shaped like a dome and has a continuously curved circumferential face. The protrusion 228 is also centrosymmetric relative to the optical axis I of the LED 10. The curved circumferential face of the protrusion 228 is located just opposite to the first light-incident face 2201. The curved circumferential face acts as a first light-emergent face 2205; most of the light transmitted from the first light-incident face 2201 leaves the lens 20 from the first light-emergent face 2205. The top face of the optical member 22 of the lens 20 acts as a second light-emergent face 2206; most of the light totally reflected by the light-reflecting face 2203 leaves the lens 20 via the second light-emergent face 2206. Thus, the lens 20 refracts nearly all of the light from the LED 10 out of the lens 20 within a small light-emergent angle. In other words, the first light-emergent face 2205 and the second light-emergent face 2206 of the lens 20 cooperatively form a light-emergent face 400 to refract the light within the lens 20 towards a place above the lens 20. The first light-emergent face 2205 has a curvature firstly increasing gradually from a bottom towards a top of the protrusion 228; after achieving a maximum value at a position adjacent to the top of the protrusion 228, the curvature starts to decrease gradually within a small range. In the embodiment of this disclosure, the first light-emergent face 2205 has a curvature of 0.0868 $mm^{-1}$ at the bottom, a maximum curvature of 0.182 $mm^{-1}$, and a curvature of 0.178 $mm^{-1}$ at the top of the protrusion 228.

Being adjusted by the first and second light-incident faces 2201, 2202, the first and second light-reflecting faces 2203, 2204, and the first and second light-emergent faces 2205, 2206, the light emitted from the LED 10 could be effectively converged within a small angle, thereby preventing a periphery of a light pattern output by the LED 10 via the lens 20 from being yellow or shining.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. An LED (light emitting diode) unit, comprising:

an LED; and a lens mounted on the LED, the lens comprising a light-incident face adjacent to the LED, a light-emergent face remote from the LED, and a light-reflecting face between the light-incident face and the light-emergent face, wherein light emitted from the LED with a small angle is refracted by the light-incident face and the light-emergent face out of the LED unit, light emitted from the LED with a large angle is sequentially refracted by the light-incident face, reflected by the light-reflecting face and refracted by the light-emergent face out of the LED unit;

wherein the light-incident face comprises a first light-incident face facing the LED, and the light-emergent face comprises a first light-emergent face located opposite to the first light-incident face; and wherein the first light-emergent face is a continuously curved face which has a curvature firstly increasing gradually and then decreasing gradually along a bottom-to-top direction of the lens, the LED being located below the first light-emergent face;

wherein the light-emergent face further comprises a second light-emergent face surrounding the first light-emergent face;

wherein the first light-emergent face is discontinuous from the second light-emergent face, the lens defining a recessed portion spacing the first light-emergent face from the second light-emergent face; and wherein the second light-emergent is directly connected with the light-reflecting face.

2. The LED unit as claimed in claim 1, wherein the first light-emergent face has a curvature of 0.0868 $mm^{-1}$ at a bottom end of the first light-emergent face.

3. The LED unit as claimed in claim 1, wherein the first light-emergent face has a maximum curvature of 0.182 $mm^{-1}$.

4. The LED unit as claimed in claim 1, wherein the first light-emergent face has a curvature of 0.178 $mm^{-1}$ at a top end of the first light-emergent face.

5. The LED unit as claimed in claim 1, wherein the first light-incident face is a spherical face and has a curvature of 0.04 $mm^{-1}$.

6. The LED unit as claimed in claim 1, wherein a bottom of the recessed portion is lower than the first light-incident face.

7. The LED unit as claimed in claim 1, wherein the first light-emergent face is a curved circumferential face of a protrusion which is shaped like a dome, and a diameter of the protrusion gradually decreases along the bottom-to-top direction of the lens.

8. The LED unit as claimed in claim 7, wherein the second light-emergent face is an annular face and the second light-emergent face is planar and faced upwardly.

9. The LED unit as claimed in claim 1, wherein the light-reflecting face comprises a first light-reflecting face which is conical and expands upwardly along the bottom-to-top direction of the lens.

10. The LED unit as claimed in claim 9, wherein the first light-reflecting face is a spherical face and has a curvature of 0.0187 $mm^{-1}$.

11. The LED unit as claimed in claim 1, wherein the light emitted from the LED with a large angle is refracted by the second light-emergent face out of the LED unit.

12. The LED unit as claimed in claim 11, wherein the light emitted from the LED with a small angle is refracted by the first light-emergent face out of the LED unit.

13. The LED unit as claimed in claim 1, wherein the light-incident face further comprises a second light-incident face surrounding the first light-incident face.

14. The LED unit as claimed in claim 13, wherein the second light-incident face is a circumferential face of a columnar portion.

15. The LED unit as claimed in claim 1, wherein the first light-incident face and the first light-emergent face are both centrosymmetric relative to a central axis of the lens.

16. The LED unit as claimed in claim 15, wherein the central axis is an optical axis of the LED.

17. An LED (light emitting diode) unit, comprising:

an LED; and a lens mounted on the LED, the lens comprising a light-incident face adjacent to the LED, a light-emergent face remote from the LED, and a light-reflecting face between the light-incident face and the light-emergent face, wherein light emitted from the LED with a small angle is refracted by the light-incident face and the light-emergent face out of the LED unit, light emitted from the LED with a large angle is sequentially refracted by the light-incident face, reflected by the light-reflecting face and refracted by the light-emergent face out of the LED unit;

wherein the light-incident face comprises a first light-incident face facing the LED, and the light-emergent face comprises a first light-emergent face located opposite to the first light-incident face; and wherein the first light-emergent face is a continuously curved face which has a curvature firstly increasing gradually and then decreasing gradually along a bottom-to-top direction of the lens, the LED being located below the first light-emergent face;

wherein the light-emergent face further comprises a second light-emergent face surrounding the first light-emergent face;

wherein the first light-emergent face is discontinuous from the second light-emergent face, the lens defining a recessed portion spacing the first light-emergent face from the second light-emergent face;

wherein the first light-emergent face is a curved circumferential face of a protrusion which is shaped like a dome, and a diameter of the protrusion gradually decreases along the bottom-to-top direction of the lens; and wherein the second light-emergent face is an annular face and the second light-emergent face is planar and faced upwardly.

18. An LED (light emitting diode) unit, comprising:

an LED; and a lens mounted on the LED, the lens comprising a light-incident face adjacent to the LED, a light-emergent face remote from the LED, and a light-reflecting face between the light-incident face and the light-emergent face, wherein light emitted from the LED with a small angle is refracted by the light-incident face and the light-emergent face out of the LED unit, light emitted from the LED with a large angle is sequentially refracted by the light-incident face, reflected by the light-reflecting face and refracted by the light-emergent face out of the LED unit;

wherein the light-incident face comprises a first light-incident face facing the LED, and the light-emergent face comprises a first light-emergent face located opposite to the first light-incident face; and wherein the first light-emergent face is a continuously curved face which has a curvature firstly increasing gradually and then decreasing gradually along a bottom-to-top direction of the lens, the LED being located below the first light-emergent face;

wherein the light-emergent face further comprises a second light-emergent face surrounding the first light-emergent face;

wherein the first light-emergent face is discontinuous from the second light-emergent face, the lens defining a recessed portion spacing the first light-emergent face from the second light-emergent face; and wherein a bottom of the recessed portion is lower than the first light-incident face.

* * * * *